(12) United States Patent
Beekmann et al.

(10) Patent No.: US 7,923,383 B2
(45) Date of Patent: Apr. 12, 2011

(54) METHOD AND APPARATUS FOR TREATING A SEMI-CONDUCTOR SUBSTRATE

(75) Inventors: Knut Beekmann, Yatton (GB); Guy Patrick Tucker, Weston Super Mare (GB)

(73) Assignee: Tokyo Electron Limited, Tokyo (JP)

( * ) Notice: Subject to any disclaimer, the term of this patent is extended or adjusted under 35 U.S.C. 154(b) by 1102 days.

(21) Appl. No.: 10/401,184

(22) Filed: Mar. 28, 2003

(65) Prior Publication Data

US 2004/0043631 A1 Mar. 4, 2004

Related U.S. Application Data

(63) Continuation of application No. 09/674,922, filed on Nov. 8, 2000, now abandoned.

(51) Int. Cl.
*H01L 21/31* (2006.01)

(52) U.S. Cl. . 438/787; 438/782; 438/790; 257/E21.262; 257/E21.266; 257/E21.277

(58) Field of Classification Search .................. 438/780, 438/781, 790, 769, 770, 771, 772, 787, 782, 438/907, 908, 909, 913; 257/E21.26, E21.261, 257/E21.262, E21.277; 118/715, 724, 641, 118/642, 643
See application file for complete search history.

(56) References Cited

U.S. PATENT DOCUMENTS

| | | | | |
|---|---|---|---|---|
| 4,829,021 A | * | 5/1989 | Fraas et al. | 438/167 |
| 4,983,419 A | * | 1/1991 | Henkel et al. | 427/492 |
| 5,202,283 A | * | 4/1993 | Younger et al. | 117/99 |
| 5,314,724 A | | 5/1994 | Tsukune et al. | |
| 5,360,646 A | | 11/1994 | Morita | |
| 5,405,492 A | * | 4/1995 | Moslehi | 438/694 |
| 5,656,555 A | * | 8/1997 | Cho | 438/760 |
| 5,668,056 A | * | 9/1997 | Wu et al. | 438/106 |
| 5,891,809 A | * | 4/1999 | Chau et al. | 438/770 |
| 5,985,769 A | | 11/1999 | Matsuura | |
| 6,054,379 A | * | 4/2000 | Yau et al. | 438/623 |
| 6,124,641 A | | 9/2000 | Matsuura | |
| 6,333,278 B1 | * | 12/2001 | Matsuura | 438/790 |
| 6,569,780 B2 | * | 5/2003 | Tanabe et al. | 438/770 |
| 2001/0049205 A1 | * | 12/2001 | Sandhu et al. | 438/787 |
| 2002/0045361 A1 | * | 4/2002 | Cheung et al. | 438/790 |

FOREIGN PATENT DOCUMENTS

| | | |
|---|---|---|
| GB | 19654737 | 7/1997 |
| JP | 6-252134 | 9/1994 |
| JP | 7-288251 | 10/1995 |
| JP | 8-227888 | 9/1996 |
| JP | 9-501020 | 1/1997 |
| JP | 9-51035 | 2/1997 |
| JP | 9-502301 | 3/1997 |
| JP | 11-16904 | 1/1999 |
| JP | 11-330069 | 11/1999 |
| JP | 2001-504989 | 4/2001 |
| WO | WO 92/12535 | 7/1992 |
| WO | WO 94/01885 | 1/1994 |
| WO | WO 95/31823 | 11/1995 |
| WO | WO 98/08249 | 2/1998 |

\* cited by examiner

*Primary Examiner* — Julio J Maldonado
(74) *Attorney, Agent, or Firm* — Oblon, Spivak, McClelland, Maier & Neustadt, L.L.P.

(57) ABSTRACT

This invention relates to a method of treating a semiconductor wafer and in particular, but not exclusively, to planarisation. The method consists of depositing a liquid short-chain polymer formed from a silicon containing bas or vapour. Subsequently water and OH are removed and the layer is stabilised.

18 Claims, 13 Drawing Sheets

METHOD AND APPARATUS FOR TREATING A SEMI-CONDUCTOR SUBSTRATE

CROSS-REFERENCE TO RELATED APPLICATIONS

This is a continuation of application Ser. No. 09/674,922, filed Nov. 8, 2000, which is incorporated herein by reference in it entirety.

BACKGROUND OF THE INVENTION

This invention relates to a method and apparatus for treating a semi-conductor substrate in particular, although not exclusively, a semi-conductor wafer.

In our earlier co-pending Patent Application WO094/01885, the contents of which are incorporated herein by reference, we describe a planarisation technique in which a liquid short-chain polymer is formed on a semi-conductor wafer by reacting silane with hydrogen peroxide. WO098/08249, which is also incorporated herein by reference, describes a method of treating a semi-conductor substrate including reacting an organo-silane compound of the general formula $C_xH_y$—$Si_nH_a$ and a compound containing peroxide bonding to provide a short-chain polymer layer on the substrate.

The prior art processes generally comprise the step of depositing the layer between two layers of high quality plasma enhanced silicon dioxide layers, i.e. a base layer and a capping layer. These provide adhesion and moisture barriers. The deposited layer includes water which is removed in a controlled manner and baked at a high temperature to "cure" the layer, thus completing the process of depositing a hard layer. It has been considered important to control the diffusion of water to avoid cracking, as described in WO095/31823, which is also incorporated herein by reference. This careful control and the provision of a capping layer are both time-consuming and expensive.

SUMMARY OF THE INVENTION

According to a first aspect of the present invention, there is provided a method of treating a semi-conductor substrate comprising the steps of:
(a) depositing on the substrate a polymer layer; and
(b) heating the substrate in the absence of oxygen prior to the deposition of any further layer to substantially remove O—H bonds from the polymer and substantially cure the layer.

The method may further comprise the step of positioning the substrate in a chamber prior to step (a), and the reactants may be introduced into the chamber in a gaseous or vapour state.

According to a further aspect of the present invention, there is provided a method of treating a semi-conductor substrate comprising the steps of:
(a) positioning the substrate in a chamber;
(b) introducing into the chamber in the gaseous or vapour state a silicon-containing compound and a further compound containing peroxide bonding, and reacting the silicon-containing compound with the further compound to provide on said substrate a polymer layer; and
(c) heating the substrate in the absence of oxygen prior to the deposition of any further layer to substantially remove O—H bonds from the polymer and substantially cure the layer.

The heating may be substantially by radiative means.

Thus, the method of the present invention provides a substrate which does not require a capping layer or a subsequent furnace bake, thereby significantly improving the throughput of the equipment, and providing equipment savings and process simplification. In addition, the present invention provides a low dielectric constant (low k) layer.

Preferably, the substrate is a wafer, for example a silicon wafer. However, any suitable substrate could be used, for example a glass or quartz panel. The method may be carried out with or without an underlayer on the substrate, for example a silicon dioxide underlayer.

Preferably, the silicon-containing compound may be of the general formula $(C_xH_y)_bSi_nH_a$, for example $C_xH_y$—$Si_nH_a$, or $(C_xH_yO)_bSi_nH_a$ or $(C_xH_yO)_bSi_nH_m(C_rH_s)_p$. The values of x, y, n, m, r, s, p a and b, can be any suitable values. Thus, the silicon-containing compound is preferably a silane or a siloxane. The silicon-containing compound is preferably a methyl silane.

The O—H bonds may be removed in the form of water.

When used, the radiative means may comprise an infra red component in the radiation spectrum.

In a preferred embodiment, the heating is carried out at a maximum temperature at or above 400° C., and preferably at a maximum temperature at or below 450° C. However, lower temperatures could be envisaged depending on the particular polymer layer deposited. Whilst silane source layers may blister when processed, variations to the process (eg lower temperatures or slower heat-up times) may yield satisfactory drying and curing of a silane source layer. The heating may be provided by any suitable source, for example one or more lamp sources or a black body emitter. The heating may be provided from a source providing infra-red heat. Alternatively, the source for providing the heating may provide UV heat. A UV source may be particularly useful in Shallow Trench Isolation applications. In one particular embodiment, the source for providing the heating comprises one or more tungsten halogen lamps, which may act through quartz. Alternatively, the heating may be provided by a platen or chuck on which the substrate is placed, for example a hot metal chuck and in this case longer process times may be required. The substrate may or may not be clamped to the chuck, although preferably no clamping pressure is applied.

The heating step may take about eight seconds to reach the maximum temperature.

The heating step may be performed by a rapid rise in layer temperature, for example by applying high power to the lamp heat source, for approximately 8 seconds followed by lower power for up to five minutes, and preferably for more than one minute. Even more preferably the heating step is performed for about three minutes. Prior to the heating step, the substrate may be transferred to a second chamber in which the heating step is performed.

The heating step may be carried out in a non super saturated environment and is preferably carried out at below atmospheric pressure. In one embodiment, the pressure is preferably about 40 mT, which may be maintained by continually pumping the chamber in which the heating step is performed. This pressure is generally as a result of background pressure of evolved gases.

Preferably the thickness of the polymer layer and base layer (where applicable) is less than 1.5 μm, even more preferably the thickness is less than 1.3 μm and it may be less than 1.25 μm. These are typical thicknesses which may avoid cracking of the substrate.

The thickness of the polymer layer is preferably between 5,000 Å and 10,000 Å, although any appropriate thickness may be used.

Whilst the substrate may be positioned in any convenient orientation, it has been found that it is particularly convenient to position the substrate such that the polymer layer is on the upward face, with heating from a source placed below the substrate. This is not to say that the layer is shielded from radiation as there may be reflection from internal chamber surfaces and the substrate itself may be transmissive to at least parts of the radiated spectrum.

According to a further aspect of the present invention, there is provided an apparatus for implementing the method described above comprising means for depositing on the substrate a polymer layer, and means for heating the substrate in the absence of oxygen prior to the deposition of any further layer.

According to a further aspect of the present invention, there is provided an apparatus for implementing the method described above, the apparatus comprising:

(a) a chamber having means for introducing therein a silicon-containing compound and a further compound containing peroxide bonding, and platen means for supporting a substrate; and (b) a chamber having means for heating the substrate in the absence of oxygen prior to the deposition of any further layer.

The chambers used in (a) and (b) may be the same or different.

In a preferred embodiment, the apparatus may further comprise means for sustaining a non super saturated environment, preferably at below atmospheric pressure.

Radiative means for heating may be provided.

The radiative means may comprise an infra red component in the radiation spectrum.

Although the invention has been defined above, it is to be understood that it includes any inventive combination of the features set out above or in the following description.

BRIEF DESCRIPTION OF THE DRAWINGS

The invention may be performed in various ways and specific embodiments will now be described, by way of example, with reference to the accompanying drawings, in which.

DESCRIPTION OF THE PREFERRED EMBODIMENTS

Figure 1:
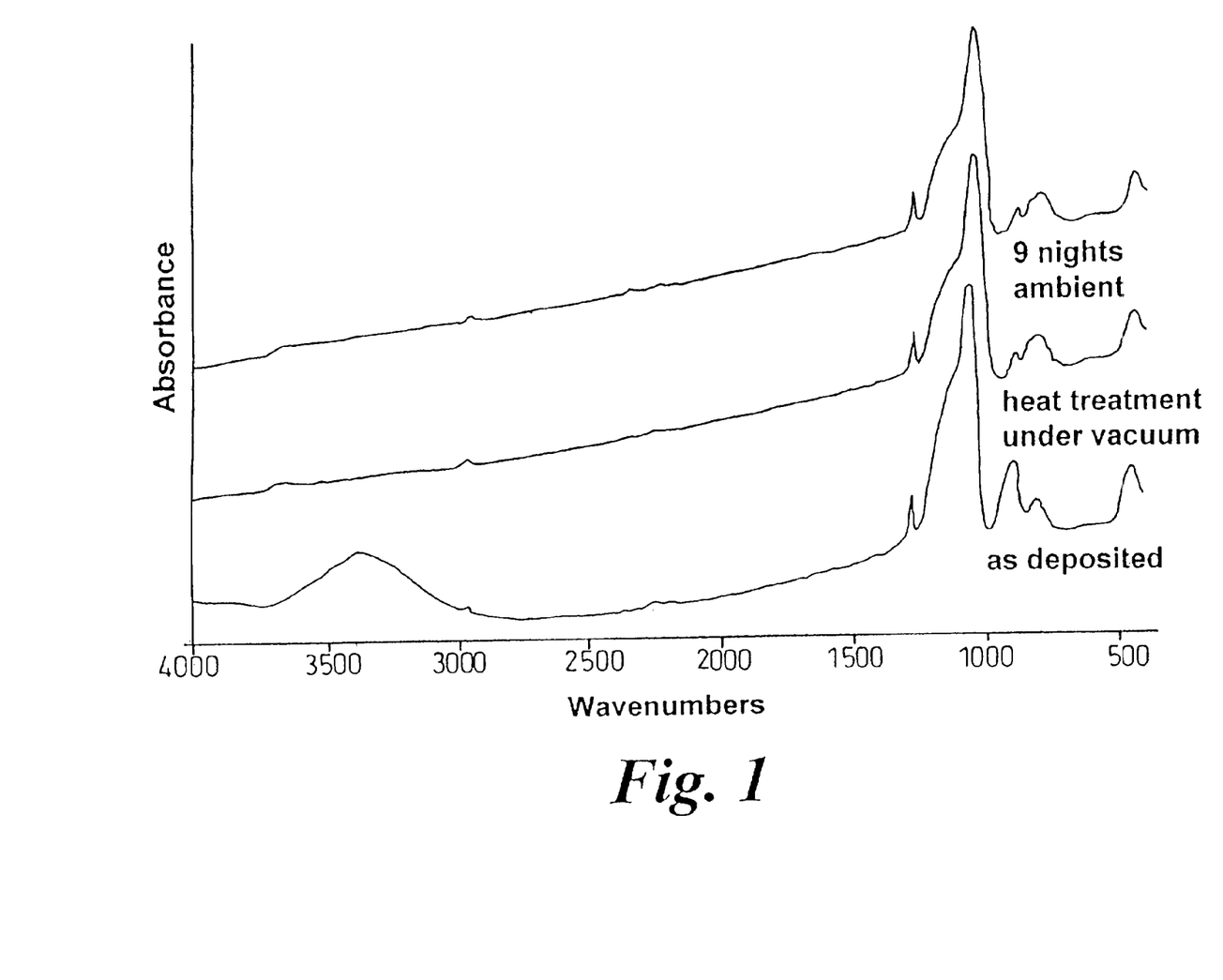
FIG. 1 shows a graph of FTIR absorbance against wave numbers for the as deposited film, after the treatment of the invention and after 9 nights in ambient atmosphere after this treatment.
Figure 2:
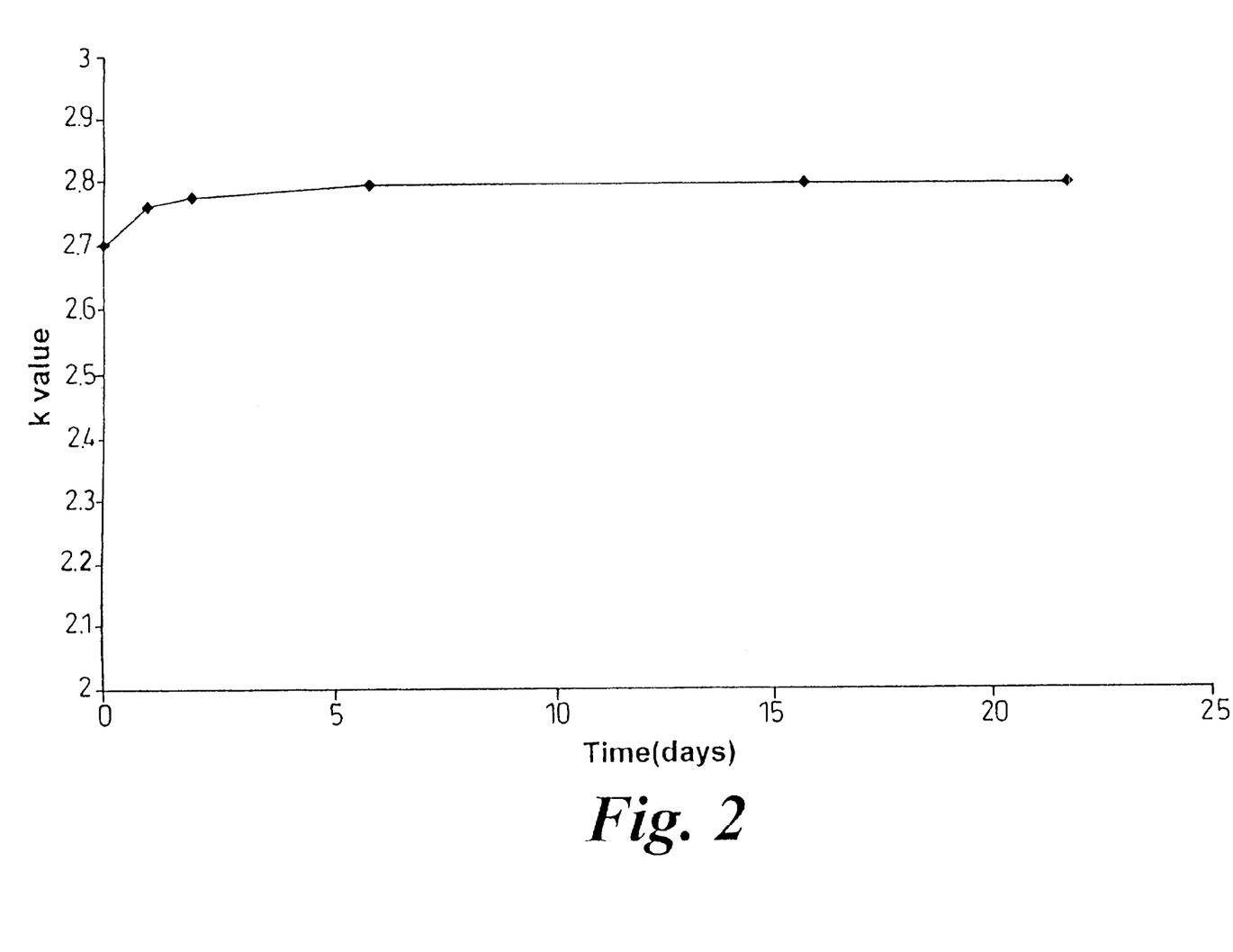
FIG. 2 shows the change in dielectric constant over time of a 8" wafer which is subject to three minutes heat treatment under vacuum and has a 7,000 Å layer on the substrate.

As can be seen from FIG. 1, water is removed by the treatment of the invention and is not reabsorbed (wavenumbers around 3000 to 3600) and it can also be seen that SiO—H bonds are removed by this heat treatment (wavenumber 920).

Figure 3:
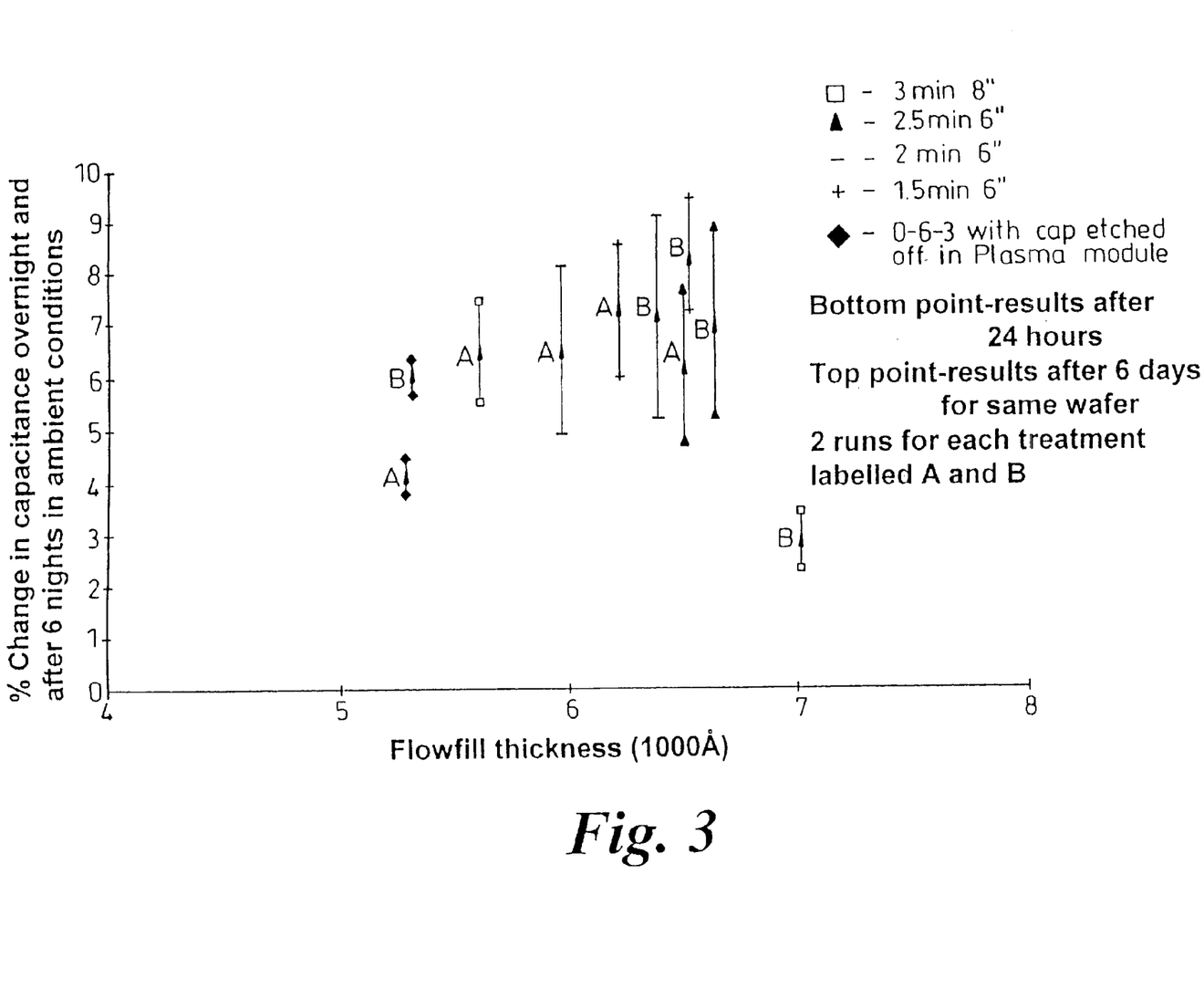
FIG. 3 shows the change in capacitance by way of comparison against the thickness of the layer on the substrate for 6" and 8" wafers at 450° C. for different treatments.
Figure 4:
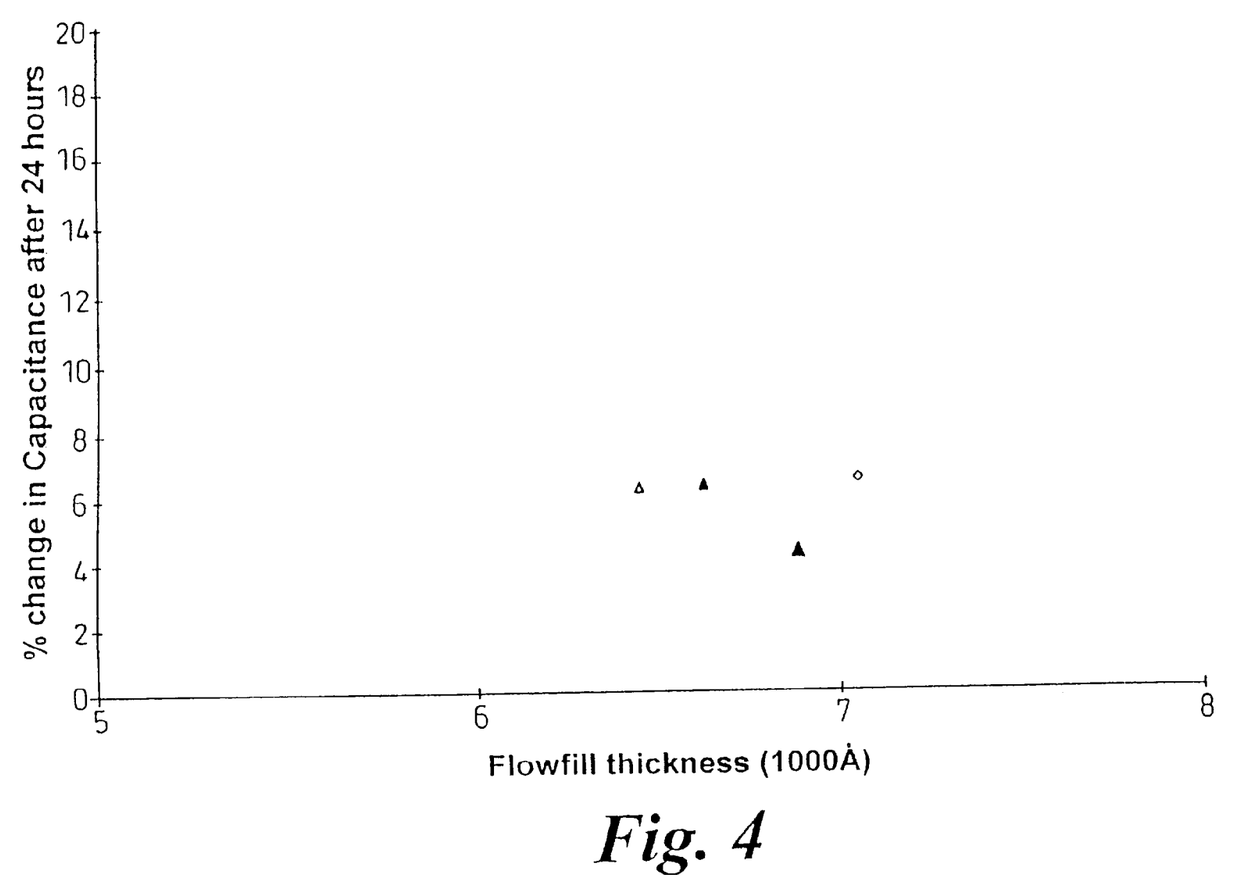
FIG. 4 shows the change in capacitance against thickness of the layer on the substrate for 6" wafers at 450° C. for one minute.
Figure 5:
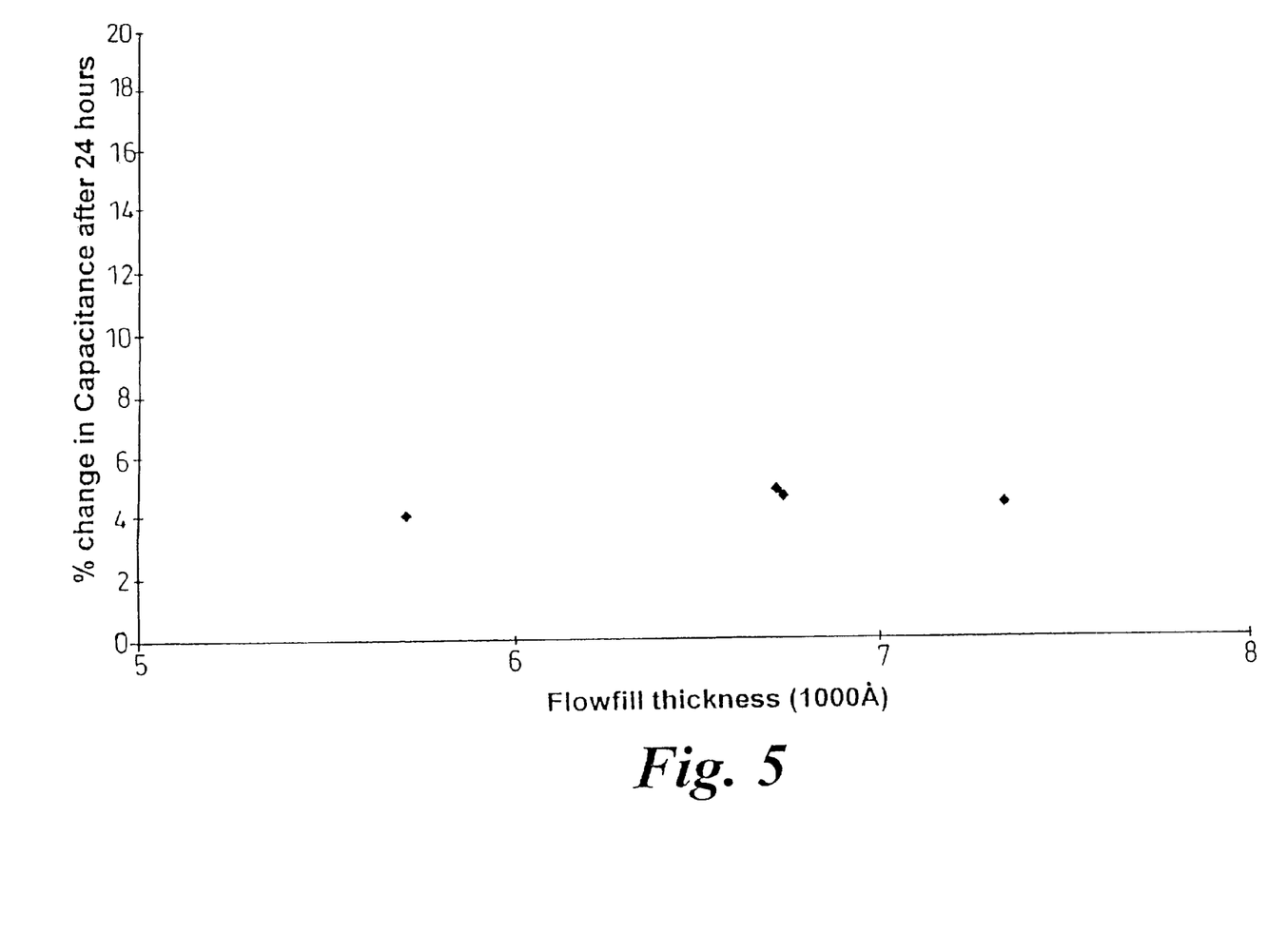
FIG. 5 shows the change in capacitance against thickness of the layer on the substrate for 6" wafers at 450° C. for three minutes.
Figure 6:
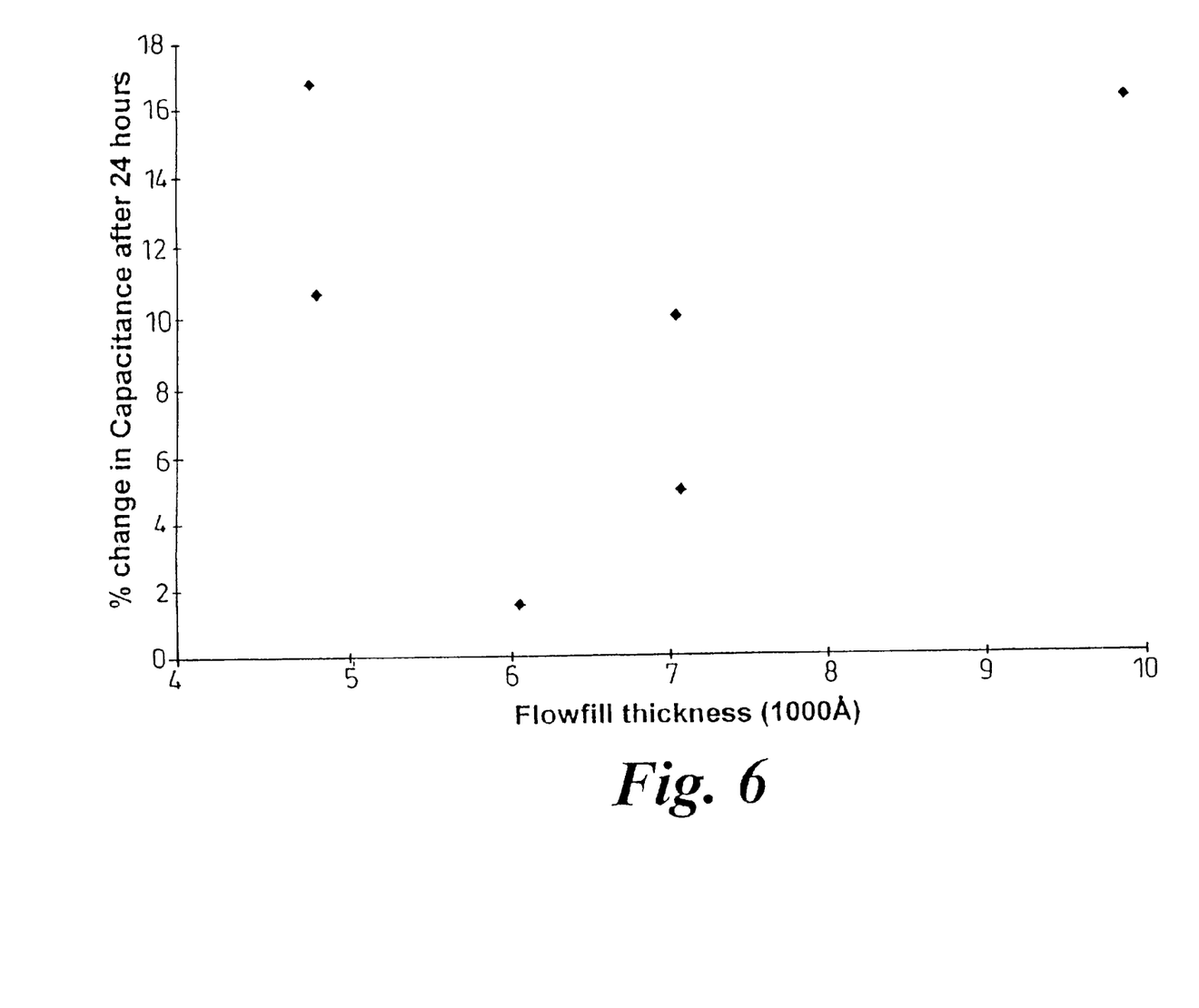
FIG. 6 shows the change in capacitance against the thickness of the layer on the substrate for 8" wafers at 450° C. for one minute.
Figure 7:
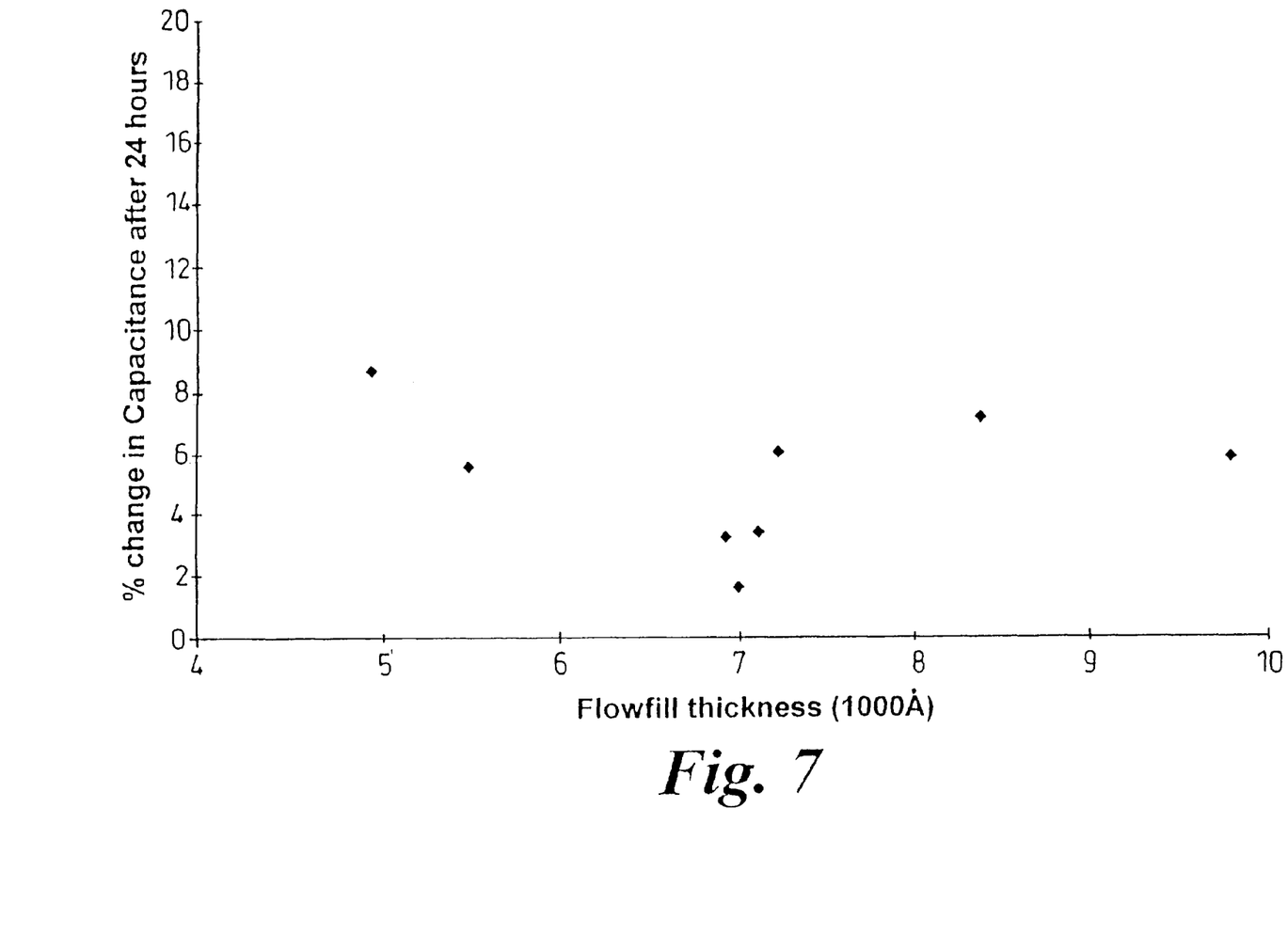
FIG. 7 shows the change in capacitance against the thickness of the layer on the substrate for 8" wafers at 450° C. for three minutes.

In FIGS. 1 to 7, all the results are based on the methyl silane deposition described below. Polymer thicknesses vary between 5,000 Å and 10,000 Å. Reabsorption of water into the film is best measured by observing the change in capacitance values over time. In FIG. 3, the bottom point shows the results after 24 hours and the top point shows the results after 6 days for the same wafer. Two runs were performed for each treatment, labelled A and B. 0-6-3 refers to the thickness in thousands of Angstroms of the base layer, polymer layer and capping layer respectively. Also included are results obtained by the capping and oven heating of a 6000 Å polymer layer. The capping layer of plasma deposited silicon dioxide has been plasma etched away leaving approximately 5200 Å of polymer layer which has then been similarly exposed to atmosphere.

Figure 10:
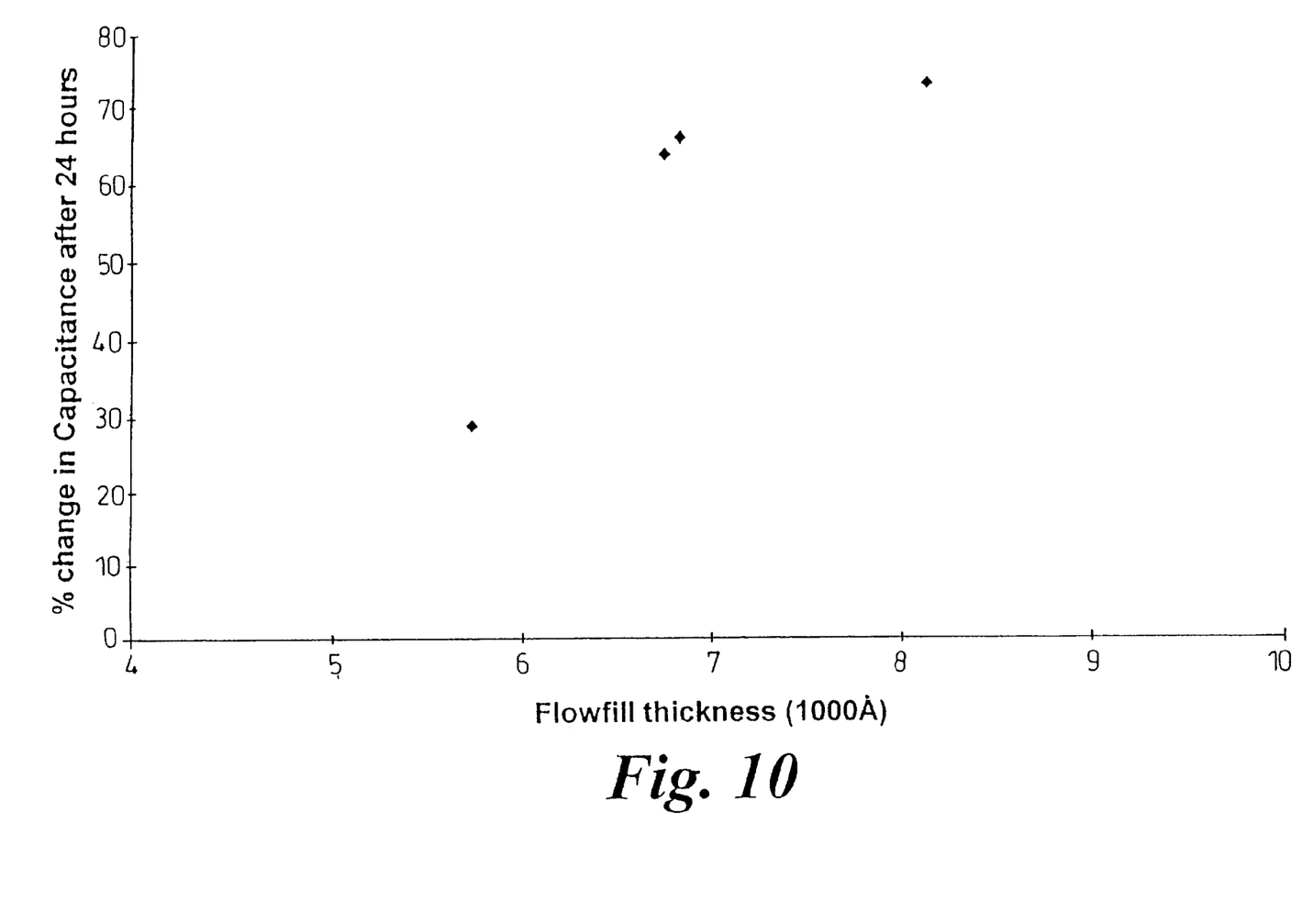
FIG. 10 in contrast shows the change in capacitance against the thickness of the layer on the substrate for 8" wafers when treated in an oven at 400° C. for 30 minutes where oxygen was present.

As can be, seen from FIG. 10, which shows the results of treatment in an oven as distinct from the radiative treatment of the invention, there are large changes in capacitance as a result of oxygen being present during the heat treatment.

Figure 11:
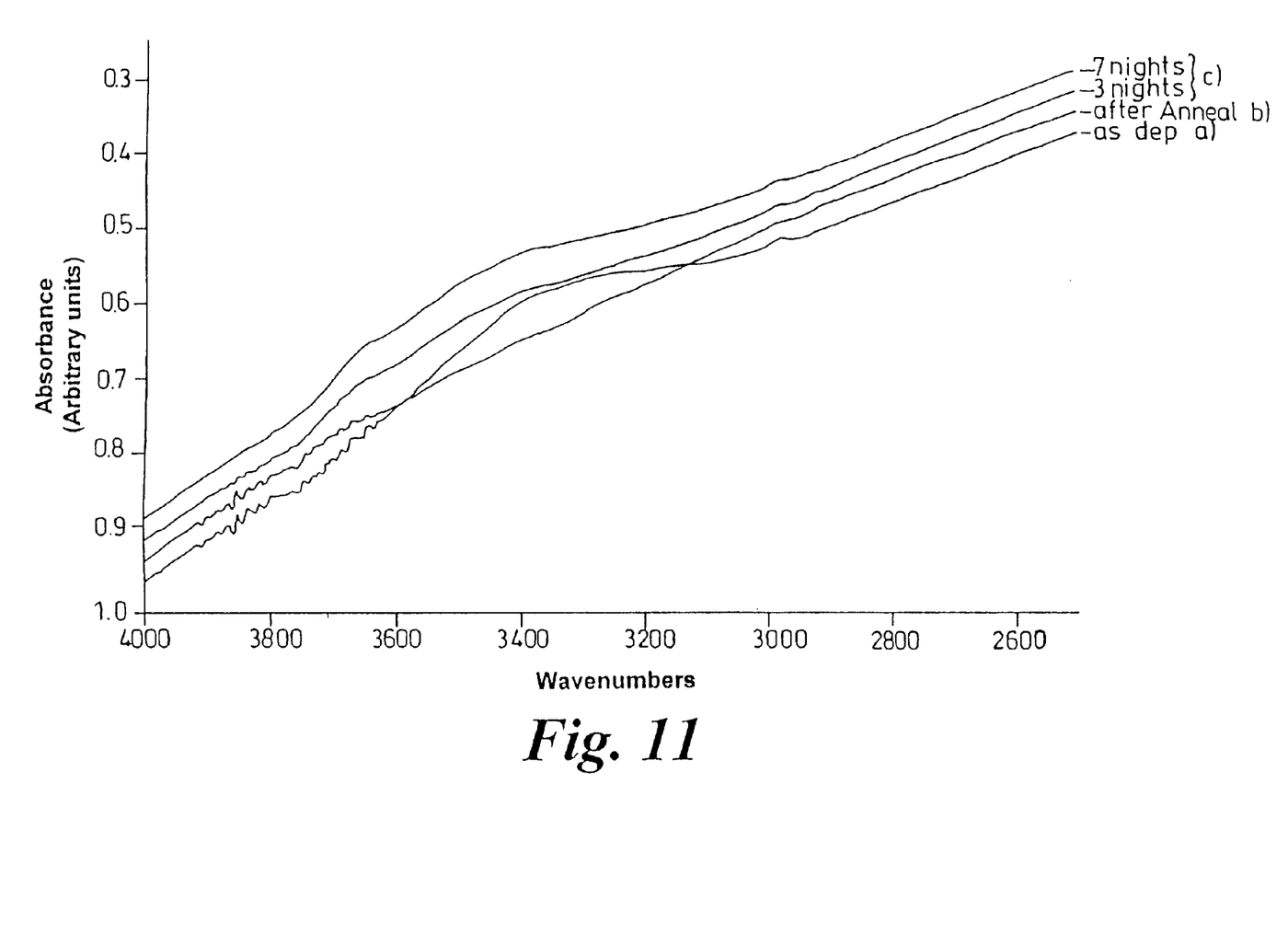
FIG. 11 shows FTIR spectra for a polymer layer treated at 500° C. in an oven in a dry nitrogen ambient and thus generally regarded as oxygen free.

In FIG. 11 are shown the results (as an expansion around wavenumber 3000 to highlight water) for a polymer layer treated at 500° C. in an oven with a dry nitrogen ambient, that is without the radiative treatment of the invention. The lines show data for the layer:

a) as deposited (no heat treatment);

b) immediately after heat treatment, showing that the water is removed; and c) 3 and 7 nights later showing that water has been reabsorbed.

Significant reabsorption of water occurs with oven treatment, which is avoided by the radiative treatment of the invention. It is believed that this is because the dry nitrogen ambient is not completely free of oxygen even though it is generally regarded as such and would generally be described as a "nitrogen bake" or "nitrogen anneal".

In addition to the results shown in FIG. 3, reabsorption results were tested by etching a cap layer of a full sequence of methyl silane deposition (ie. having been deposited over a silicon dioxide underlayer with a silicon dioxide capping layer over the silicon dioxide deposited layer) where 7000 Å of methyl source film and 3000 Å of plasma deposited silicon oxide capping layer with or without a 1000 Å base layer of plasma deposited silicon dioxide were used. The capping layer was dry etched off in a Plasma chamber using the following parameters: 1400 mT, 750/250 sccm $CF_4/O_2$, 1 kW, 25 secs. The layer left was about 5,500 Å thick. Results gave a change in capacitance of 2.1% and 5.7% in 24 hours. After 6 nights change in capacitance between 2.3% and 6.9%. No differences were found between base and baseless wafers.

Figure 8:
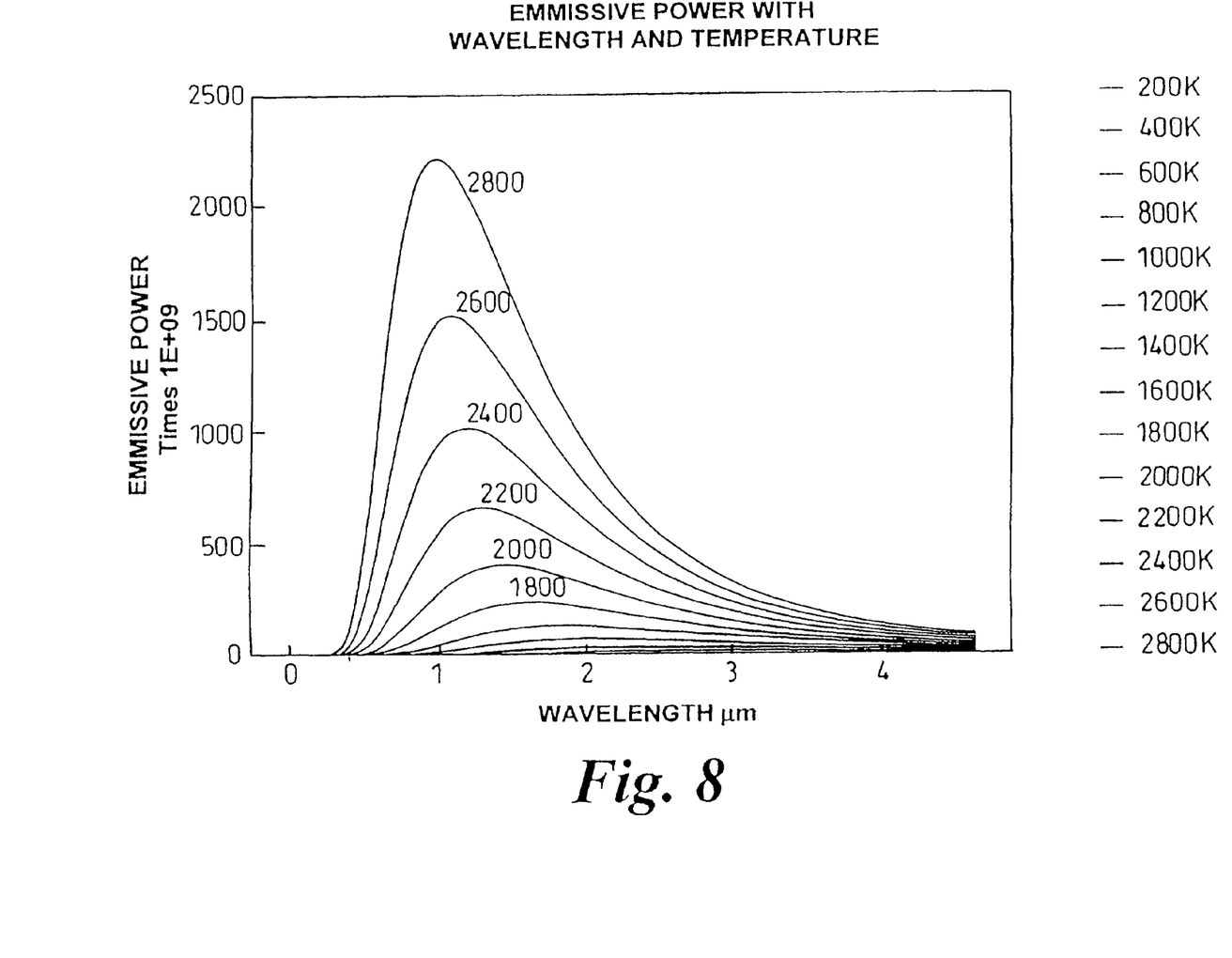
FIG. 8 shows the relative emissive power of a lamp with wavelength and temperature.
Figure 9:
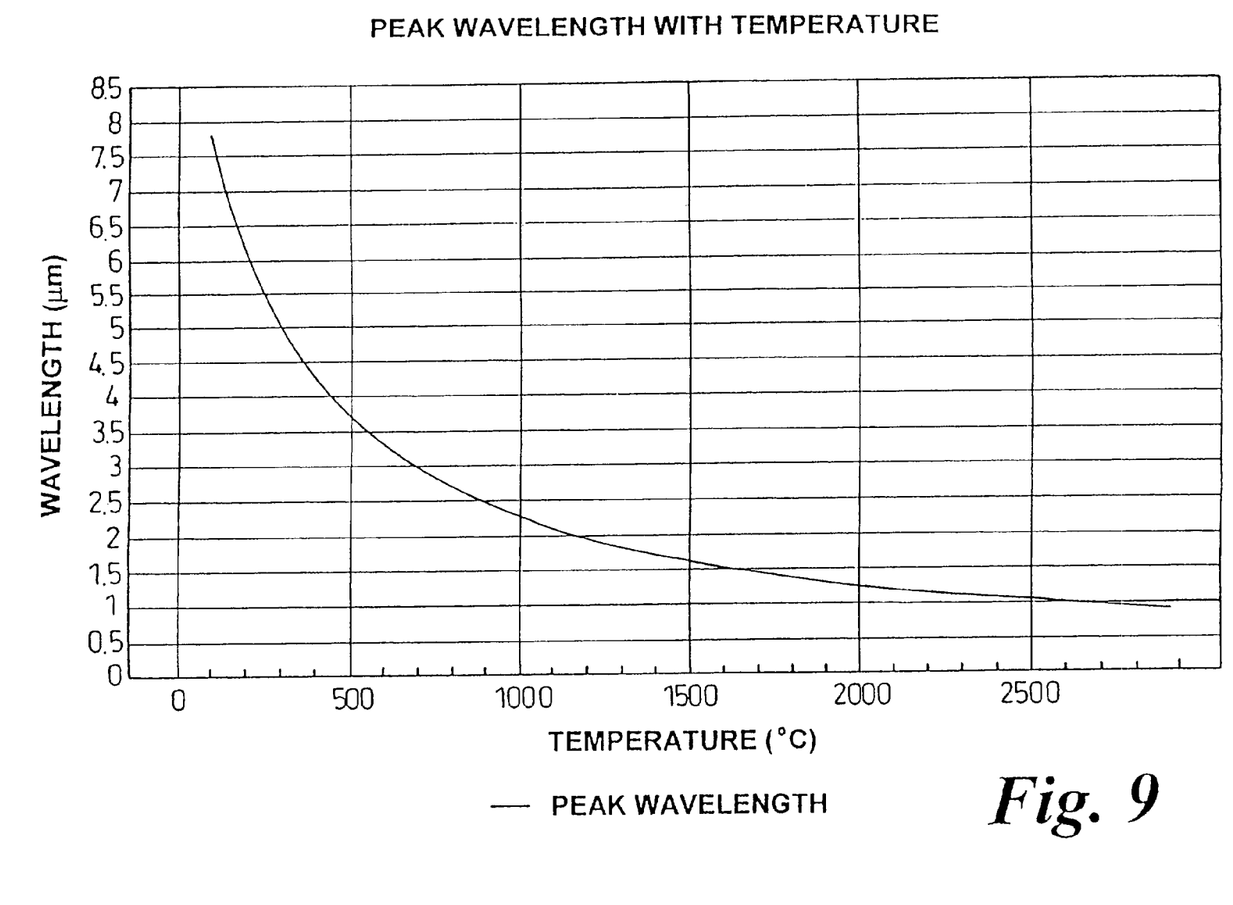
FIG. 9 shows the peak wavelength of a lamp with filament temperature.

To arrive at the graphical results shown in FIGS. 1-7, 10 and 11 methyl silane deposition (D120) was carried out in accordance with the present invention, the conditions for which were as follows:

80 sccm methyl silane were reacted in a chamber with 0.75 g/m hydrogen peroxide under a pressure of 1,000 mTorr to form a polymeric layer on a silicon substrate. The substrate was then transferred out of the vacuum to the atmosphere where it was left for a significant period of time (for example days or even weeks). It was then transferred back into a vacuum where heat is applied, in accordance with the present invention. In the specific embodiment, the heater comprises multiple tungsten halogen theatre spotlights (i.e. a broad band white light) through quartz (which provides a cut-off at around 400 nm). The data for such a lamp is shown in FIGS. 8 and 9.

The atmospheric exposure between deposition and heat treatment was a necessary consequence of not having the heat treatment station on the methyl deposition system. This does not appear to be detrimental. It is the exclusion of oxygen (preferably below 100 parts per million) during the heat treatment step that is critical in ensuring that the layer does not subsequently absorb water.

Results of the method of the invention were compared to a standard method involving methyl silane and a caping layer. The standard method includes transferring the wafer under vacuum from the platen at 0° C. to an aluminium platen at 350° C. and plasma depositing a capping layer of approximately 3,000 Å before air exposure and subsequent furnace bake.

The present invention avoids the need for the capping layer and convection furnace bake. It has been found that for methyl silane materials it is preferable to use a vacuum heat process to harden and complete the process without the necessity for a plasma deposited capping layer. Whilst the Applicant does not wish to be restricted hereby, this is considered to be as a result of the exclusion of oxygen during the heat treatment.

In terms of the process time (ie. the time of the final heating step in the vacuum), a three minute process provides suitable reabsorption results but good results are also obtained using other process times. In terms of the process pressure, the pressure is preferably set at approximately 40 mTorr during the processes with continual pumping.

Figure 12:
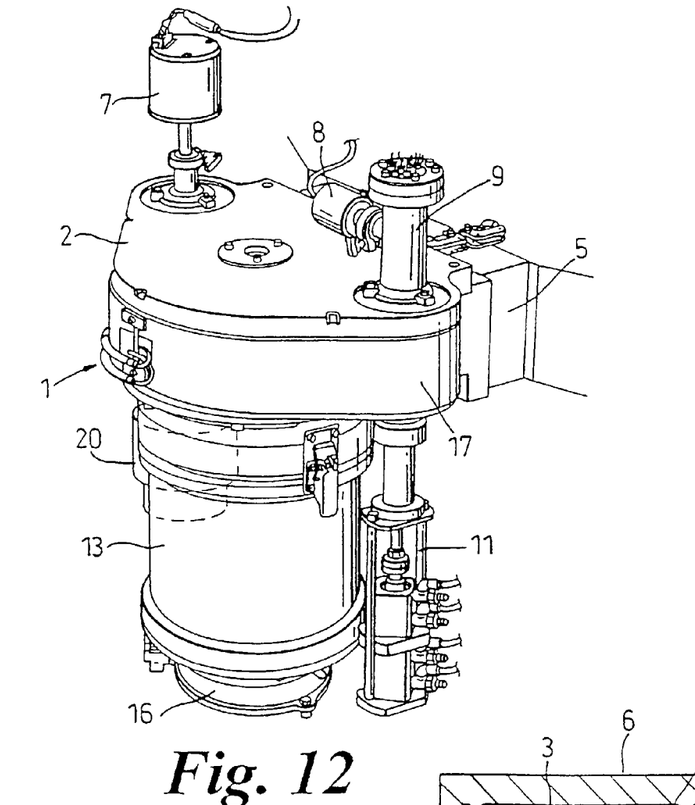
FIG. 12 shows a perspective view of an apparatus according to the present invention.
Figure 13:
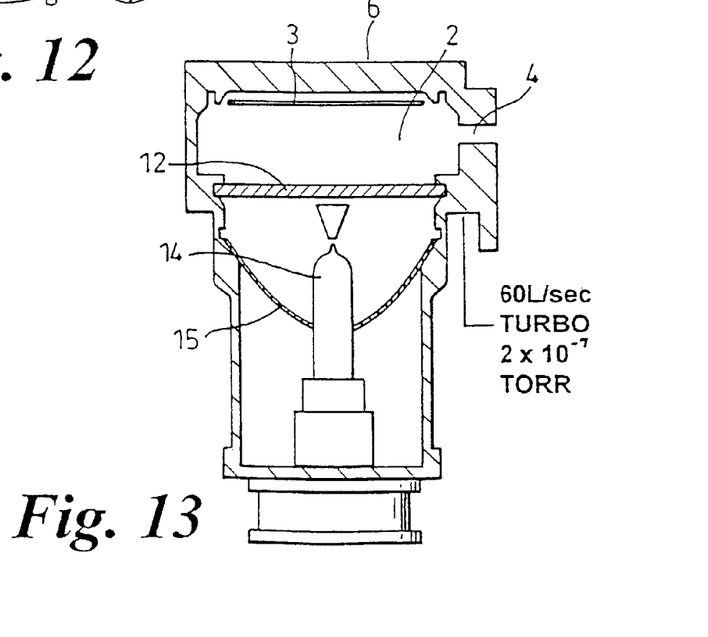
FIG. 13 shows a cross-section view of an apparatus according to the present invention.
Figure 14:
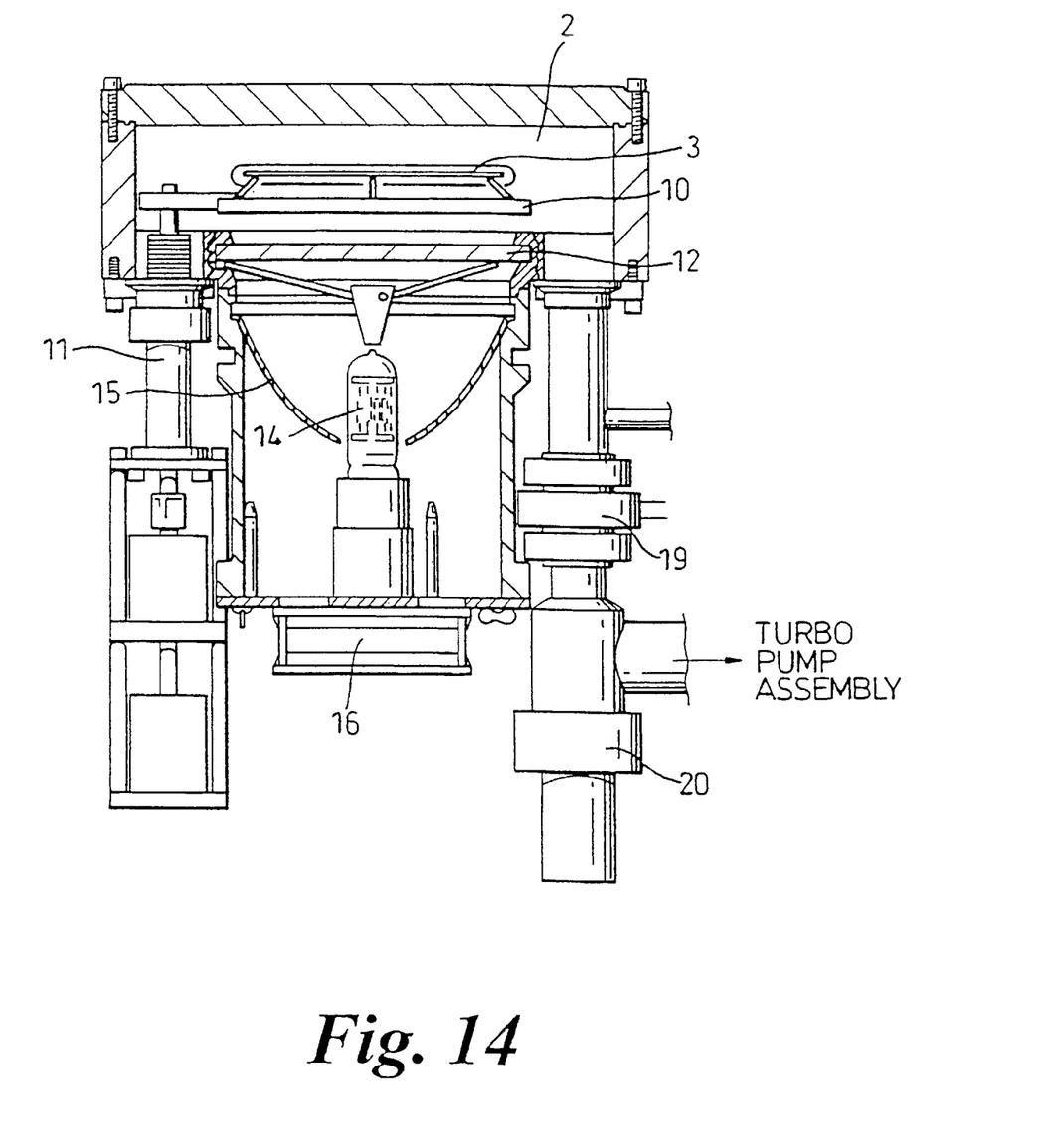
FIG. 14 shows an alternative cross-section view of an apparatus according to the present invention.

FIGS. 12 to 14 show an apparatus generally at 1 in accordance with the invention. FIG. 14 is a more detailed view than the schematic view in FIG. 13. The apparatus 1 comprises a chamber 2 into which the reactants may be passed in the absence of oxygen and within which a wafer 3 may be positioned through a wafer loading slot 4. A door module is shown at 5. The chamber comprises a polished lid 6 on which is arranged a manometer 7, an atmospheric sensor 8 and an ionisation gauge tube 9. The wafer 3 is positioned on a support 10 and is lifted by a bellows wafer lift assembly 11. A quartz chamber base 12 is provided. Beneath the chamber 2 is a lamp unit 13 within which is positioned a heating lamp 14 which may be, for example, a tungsten halogen lamp. The lamp 14 is substantially housed within a parabolic reflector 15. Positioned beneath the lamp unit 13 is a cooling fan 16. The chamber 2 may be heated by an electrical heating jacket 17.

Connected to the chamber 2 is a turbo pump assembly (not shown) connected via an automatic pressure control 19 and a valve 20.

The invention claimed is:

1. A method of treating a semi-conductor substrate comprising the steps of:
    (a) positioning the substrate in a deposition chamber;
    (b1) introducing into the deposition chamber in the gaseous or vapour state a silicon-containing compound and a further compound containing peroxide bonding, and reacting the silicon-containing compound with the further compound to provide on said substrate a polymer layer; and then
    (b2) removing said substrate having the polymer layer from the deposition chamber for a period of days and then positioning the substrate in a heat treatment chamber and as a result exposing the polymer layer to ambient atmosphere; and
    (c) in the heat treatment chamber, heating, by radiative means, the substrate in an atmosphere having an oxygen content below 100 parts per million prior to the deposition of any further layer to substantially remove O—H bonds from the polymer and substantially cure the layer.

2. A method according to claim 1, wherein the silicon-containing compound is a silane or a siloxane.

3. A method according to claim 2, wherein the silicon-containing compound is a methyl silane.

4. A method according to claim 1, wherein the O—H bonds are removed in the form of water.

5. A method according to claim 1, wherein the radiative means comprises an infra red component in the radiation spectrum.

6. A method according to claim 1, wherein the heating is carried out at a maximum temperature at or above 400° C.

7. A method according to claim 1, wherein the heating is carried out at a maximum temperature at or below 450° C.

8. A method according to claim 1, wherein the heating is provided by a lamp source.

9. A method according to claim 1, wherein the heating is provided by a black body emitter.

10. A method according to claim 1, wherein the heating step is carried out in a non super saturated environment.

11. A method according to claim 1, wherein the heating step is carried out at below atmospheric pressure.

12. A method according to claim 1, wherein the thickness of the polymer layer is less than 1.5 µm.

13. A method according to claim 1, wherein the thickness of the polymer layer is between 5000 Å and 10000 Å.

14. A method according to claim 1, wherein the substrate is positioned such that the polymer layer is on the upper face, with heating from a source placed below the substrate.

15. The method according to claim 1, wherein water is absorbed on the polymer layer when the polymer layer is exposed to ambient atmosphere.

16. The method according to claim 1, wherein the polymer layer is exposed to the ambient atmosphere for a period of weeks.

17. The method according to claim 15, wherein the heating (c) is carried out to form a cured polymer layer that does not re-absorb water.

18. The method according to claim 1, wherein during the heating the O—H bonds are removed from the polymer to form water.

* * * * *